(12) United States Patent
Ludicky

(10) Patent No.: US 10,557,879 B2
(45) Date of Patent: Feb. 11, 2020

(54) SENSOR EXCITATION IN SYSTEMS WHERE REMOTE SENSOR SIGNAL PROCESSING IS PERFORMED

(71) Applicant: Hamilton Sundstrand Corporation, Charlotte, NC (US)

(72) Inventor: Frank J Ludicky, Delavan, WI (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 286 days.

(21) Appl. No.: 15/614,293

(22) Filed: Jun. 5, 2017

(65) Prior Publication Data
US 2018/0348275 A1 Dec. 6, 2018

(51) Int. Cl.
*G01R 29/08* (2006.01)
*G01F 1/58* (2006.01)
*G01F 1/60* (2006.01)
*H01F 27/28* (2006.01)
*H01F 7/06* (2006.01)
*H01F 27/42* (2006.01)
*H02M 7/02* (2006.01)
*H04Q 9/00* (2006.01)

(52) U.S. Cl.
CPC ......... *G01R 29/0878* (2013.01); *G01F 1/586* (2013.01); *G01F 1/60* (2013.01); *H01F 7/064* (2013.01); *H01F 27/28* (2013.01); *H01F 27/42* (2013.01); *H02M 7/02* (2013.01); *H04Q 9/00* (2013.01)

(58) Field of Classification Search
CPC ...... G01R 1/28; G01R 13/00; G01R 13/0272; G01R 13/34; G01R 13/345; G01R 19/04; G01R 19/2506; G01R 23/16
See application file for complete search history.

(56) References Cited

U.S. PATENT DOCUMENTS

| | | | |
|---|---|---|---|
| 5,703,576 A | 12/1997 | Spillman, Jr. et al. | |
| 5,764,927 A * | 6/1998 | Murphy | G05B 19/0423 710/105 |
| 9,389,260 B2 | 7/2016 | Potyrailo et al. | |
| 2005/0021712 A1* | 1/2005 | Chassapis | G08C 17/00 709/223 |
| 2015/0323580 A1* | 11/2015 | Olson | G01V 3/10 324/207.22 |

FOREIGN PATENT DOCUMENTS

| | | |
|---|---|---|
| CN | 202372137 | 8/2012 |
| CN | 205508098 | 8/2016 |
| WO | 2012149008 A2 | 11/2012 |

OTHER PUBLICATIONS

European Patent Office, European Search Report dated Oct. 5, 2018 in Application No. 18175506.7-1215.

* cited by examiner

*Primary Examiner* — Tung X Nguyen
(74) *Attorney, Agent, or Firm* — Snell & Wilmer, L.L.P.

(57) ABSTRACT

A sensor control arrangement may comprise a host controller, a remote sensor interface, a power/data bus extending between the host controller and the remote sensor interface, and an electromagnetic sensor configured to receive an AC signal from the host controller via the power/data bus, and send an a sensor signal to the remote sensor interface via the power/data bus.

20 Claims, 3 Drawing Sheets

SENSOR EXCITATION IN SYSTEMS WHERE REMOTE SENSOR SIGNAL PROCESSING IS PERFORMED

FIELD

The disclosure generally relates to electrical sensing systems, and more particularly to the design of a sensor control system for remote sensors.

BACKGROUND

Electromagnetic sensors typically use significant interconnect for sensor excitation and sensor information recovery. In some systems, to reduce the amount of interconnect from the sensor to other portions of the system, sensor excitation synthesis may be done remotely at the location of the sensor. However, the size and weight of the circuitry for exciting the sensor may be excessive, resulting in excessive circuitry at the remote location of the sensor.

SUMMARY

A sensor control arrangement is disclosed herein, in accordance with various embodiments. The sensor control arrangement may comprise a host controller, a remote sensor interface, a power/data bus extending between the host controller and the remote sensor interface, and an electromagnetic sensor. The electromagnetic sensor may be configured to receive an AC signal from the host controller via the power/data bus, and send a sensor signal to the remote sensor interface via the power/data bus.

In various embodiments, the remote sensor interface may receive the AC signal. The host controller may comprise a first data communication interface, an excitation signal synthesizer in electronic communication with the first data communication interface, and an amplifier. The remote sensor interface may comprise an AC to DC power conditioner, a signal processor, and a second data communication interface. The AC to DC power conditioner may receive the AC signal and may convert the AC signal into a DC power signal. The signal processor and/or the second data communication interface may be powered by the DC power signal. At least three wires may extend between the sensor and the signal processor. The electromagnetic sensor may comprise a linear variable differential transformer. The electromagnetic sensor may comprise a rotary variable differential transformer. The power/data bus may comprise less than five wires.

A sensor control arrangement is disclosed herein, in accordance with various embodiments. The sensor control arrangement may comprise a host controller located at a first location, a remote sensor interface located at a second location, wherein the second location is spaced apart from the first location by a distance, a power/data bus extending between the host controller and the remote sensor interface, and an electromagnetic sensor in electronic communication with the remote sensor interface, wherein the host controller is configured to send an alternating current (AC) signal to the remote sensor interface via the power/data bus, wherein the electromagnetic sensor is configured to receive the AC signal, and wherein the remote sensor interface is configured to receive an analog sensor signal from the electromagnetic sensor, convert the analog sensor signal to a digital sensor signal, and send the digital sensor signal to the host controller via the power/data bus.

In various embodiments, the remote sensor interface may be configured to convert the AC signal to a direct current (DC) signal. The electromagnetic sensor may be in electronic communication with the remote sensor interface via at least three wires. The electromagnetic sensor may comprise a linear variable differential transformer (LVDT). The electromagnetic sensor may comprise a rotary variable differential transformer (RVDT). The distance may comprise at least two feet. The AC signal and the digital sensor signal may be sent via the same wires of the power/data bus.

A method for exciting an electromagnetic sensor is disclosed herein, in accordance with various embodiments. The method may comprise generating, by a host controller, an alternating current (AC) signal, sending, by the host controller, the AC signal to a remote sensor interface, via a power/signal bus, sending, by the host controller, the AC signal to the electromagnetic sensor, via the power/signal bus, receiving, by the host controller, a sensor feedback signal from the remote sensor interface, and adjusting, by the host controller, a parameter of the AC signal, in response to the sensor feedback signal.

In various embodiments, the method may further comprise powering, by the host controller, the remote sensor interface via the AC signal. The method may further comprise powering, by the host controller, the electromagnetic sensor via the AC signal.

The foregoing features, elements, steps, or methods may be combined in various combinations without exclusivity, unless expressly indicated herein otherwise. These features, elements, steps, or methods as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the detailed description and claims when considered in connection with the drawing figures, wherein like numerals denote like elements.

DETAILED DESCRIPTION

The detailed description of various embodiments herein makes reference to the accompanying drawings, which show various embodiments by way of illustration. While these various embodiments are described in sufficient detail to enable those skilled in the art to practice the inventions, it should be understood that other embodiments may be realized and that logical, chemical and mechanical changes may be made without departing from the spirit and scope of the inventions. Thus, the detailed description herein is presented for purposes of illustration only and not of limitation. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

In the detailed description herein, references to "one embodiment", "an embodiment", "various embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

As used herein, "electronic communication" means communication of electronic signals with physical coupling (e.g., "electrical communication" or "electrically coupled") or without physical coupling and via an electromagnetic field (e.g., "inductive communication" or "inductively coupled" or "inductive coupling"). In that regard, use of the term "electronic communication" includes both "electrical communication" and "inductive communication."

Figure 1:
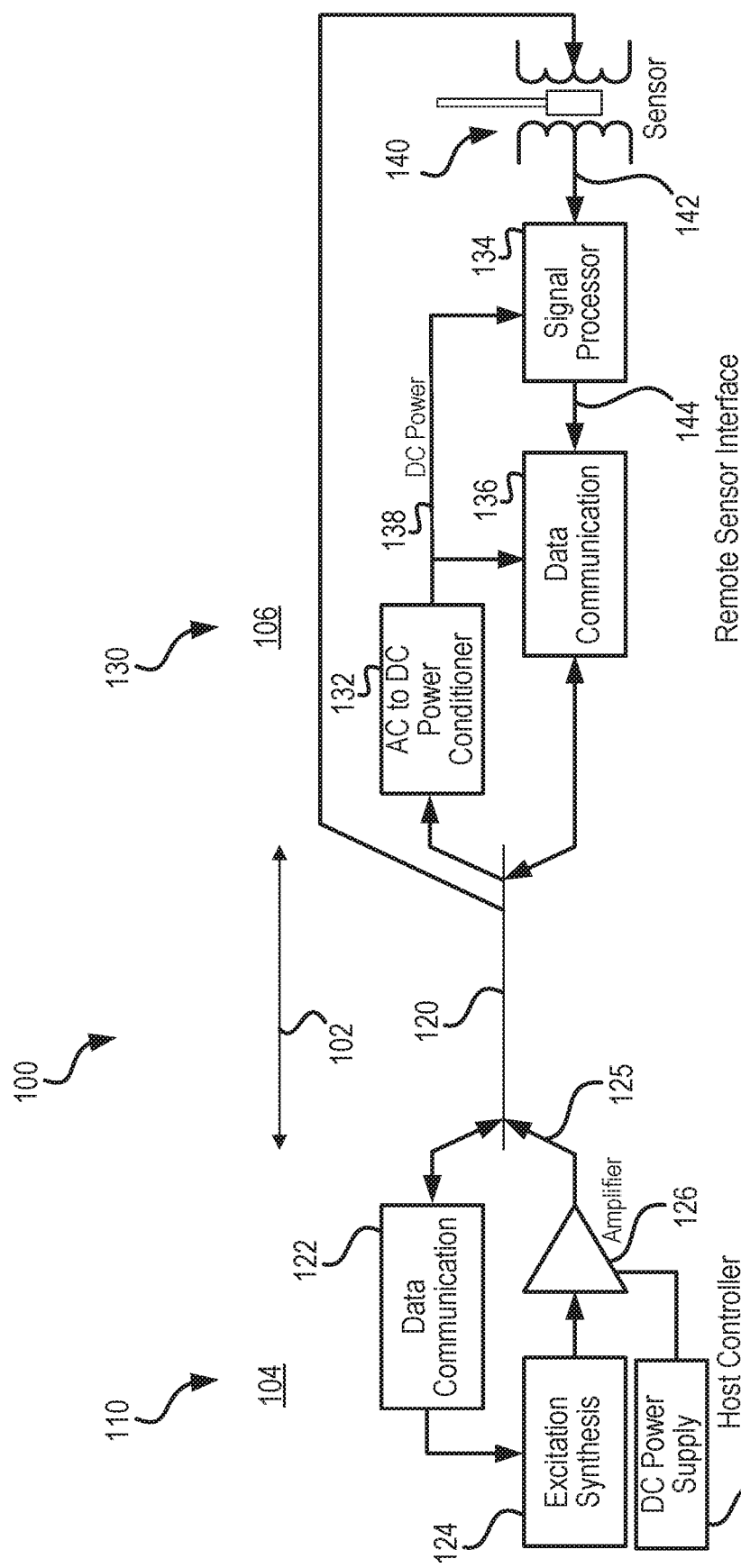
FIG. 1 illustrates a schematic view of a sensor control arrangement, in accordance with various embodiments.

With reference to FIG. 1, a sensor control arrangement 100 is illustrated, in accordance with various embodiments. Sensor control arrangement 100 may comprise a host controller 110, a power/data bus 120, and a remote sensor interface 130. Host controller 110 may comprise a data communication interface (also referred to herein as a first data communication interface) 122, an excitation signal synthesizer 124, and an amplifier 126. Remote sensor interface 130 may comprise an AC/DC power conditioner 132, a signal processor 134, and a data communication interface (also referred to herein as a second data communication interface) 136. Sensor control arrangement 100 may further comprise an electromagnetic sensor 140.

In various embodiments, remote sensor interface 130 may be located remotely from host controller 110. In this regard, power/data bus 120 may comprise a length 102. In various embodiments, length 102 may be at least two feet (0.6096 m), and in various embodiments, length 102 may be up to 328 feet (100 m) or longer, for example. In this regard, it may be desirable to reduce the number of interconnects between remote sensor interface 130 and host controller 110 to reduce the weight and/or size of sensor control arrangement 100. In various embodiments, power/data bus 120 may comprise a plurality of wires. In various embodiments, power/data bus 120 may comprise less than five wires.

In this regard, host controller 110 may be located at a first location 104 and remote sensor interface 130 may be located at a second location 106. First location 104 and second location 106 may be separated by a distance being less than or equal to length 102.

In various embodiments, excitation signal synthesizer 124 may generate an alternating current (AC) signal 125 via amplifier 126. Host controller 110 may send AC signal 125 to remote sensor interface 130.

Figure 2A:
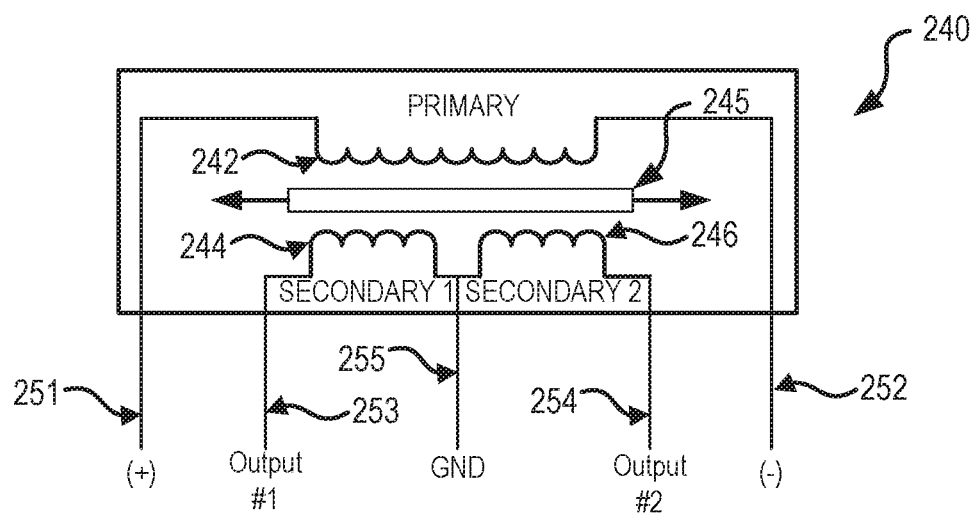
FIG. 2A illustrates a schematic view of an electromagnetic sensor comprising a linear variable differential transformer (LVDT) having a plurality of wires extending therefrom, in accordance with various embodiments.
Figure 2B:
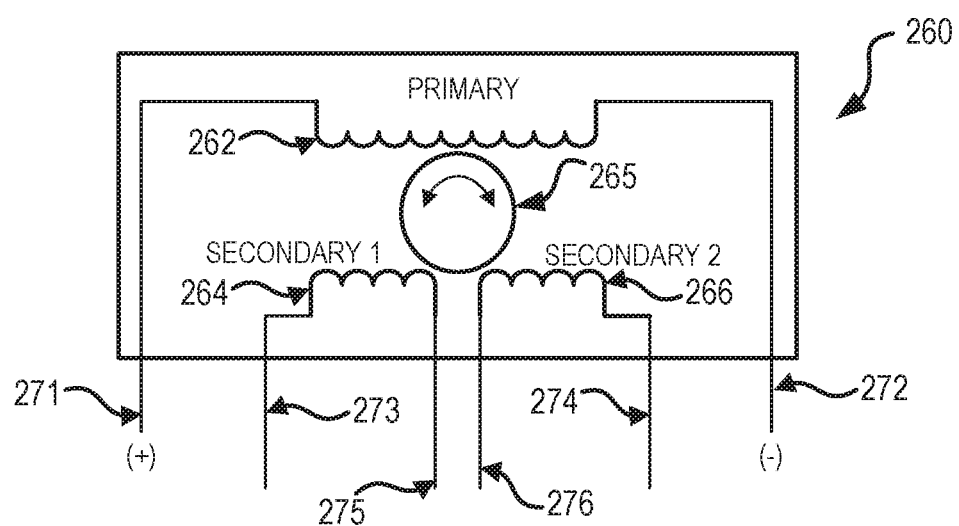
FIG. 2B illustrates a schematic view of an electromagnetic sensor comprising a rotary variable differential transformer (RVDT) having a plurality of wires extending therefrom, in accordance with various embodiments.

With combined reference to FIG. 1, FIG. 2A, and FIG. 2B, electromagnetic sensor 140 may be similar to linear variable differential transformer (LVDT) 240 or rotary variable differential transformer (RVDT) 260. LVDT 240 may comprise a primary coil 242, a first secondary coil 244, a second secondary coil 246, and a ferromagnetic core 245. LVDT 240 may comprise two primary coil leads (i.e., first primary lead 251 and second primary lead 252). Primary coil 242 may be excited in response to an excitation signal (e.g., AC signal 250) received via first primary lead 251 and second primary lead 252. LVDT 240 may comprise three secondary coil leads (i.e., first secondary lead 253, second secondary lead 254, and third secondary lead 255). In various embodiments, first primary lead 251, second primary lead 252, first secondary lead 253, second secondary lead 254, and third secondary lead 255 may comprise wires. RVDT 260 may comprise a primary coil 262, a first secondary coil 264, a second secondary coil 266, and a ferromagnetic core 265. RVDT 260 may comprise two primary coil leads (i.e., first primary lead 271 and second primary lead 272). Primary coil 262 may be excited in response to an excitation signal (e.g., AC signal 250) received via first primary lead 271 and second primary lead 272. RVDT 260 may comprise four secondary coil leads (i.e., first secondary lead 273, second secondary lead 274, third secondary lead 275, and fourth secondary lead 276). In various embodiments, first primary lead 271, second primary lead 272, first secondary lead 273, second secondary lead 274, third secondary lead 275, and fourth secondary lead 276 may comprise wires.

In this regard, electromagnetic sensor 140 may comprise a plurality of secondary leads. Said secondary leads may be coupled between electromagnetic sensor 140 and signal processor 134. Signal processor 134 may be located in close proximity to electromagnetic sensor 140. For example, the distance between signal processor 134 and sensor 140 may be less than half of the length 102, and in various embodiments, less than a tenth of the length 102. In various embodiments, the distance between signal processor 134 and sensor 140 may be less than 3.28 feet (1 m). By placing signal processor 134 in close proximity to electromagnetic sensor 140, as opposed to placing signal processor 134 at location 104 for example, the weight of the plurality of leads extending between signal processor 134 and electromagnetic sensor 140 may be reduced. In this regard, electromagnetic sensor 140 may comprise at least three wires extending between electromagnetic sensor 140 and signal processor 134. In this regard, the number of wires of power/data bus 120 may be reduced.

In various embodiments, with reference to FIG. 1, AC signal 125 may be received by electromagnetic sensor 140. Electromagnetic sensor 140 may sense the position of an adjacent component. Electromagnetic sensor 140 may output a sensor signal 142. Sensor signal 142 may comprise an analog signal. In this regard, sensor signal 142 may be referred to herein as an analog sensor signal. Sensor signal 142 may be received by signal processor 134. Signal processor 134 may process sensor signal 142 and generate a sensor signal (also referred to herein as a sensor feedback signal) 144. Sensor signal 144 may comprise a digital signal. In this regard, sensor signal 144 may be referred to herein as a digital sensor signal. Sensor signal 144 may comprise information regarding parameters of sensor signal 142 (e.g., magnitude, frequency, etc.) as well as position information. Sensor signal 144 may be sent to data communication interface 136 whereby it may be sent to data communication interface 122 via power/data bus 120. Excitation signal synthesizer 124 may receive sensor signal 144 via data communication interface 122 and may adjust one or more parameters (e.g., magnitude) of AC signal 125 based upon sensor signal 144. For example, excitation signal synthesizer 124 may determine that the amplitude of sensor signal 142 is below a threshold value and may increase the amplitude of AC signal 125 to increase the power received by electromagnetic sensor 140, which may in turn increase the amplitude of sensor signal 142.

In various embodiments, AC/DC power conditioner 132 may receive AC signal 125 via power/data bus 120. AC/DC power conditioner 132 may convert AC signal 125 into a DC power signal 138. Data communication interface 136 and/or signal processor 134 may be powered via DC power signal 138. DC power signal 138 may comprise, for example, between one and five volts. In this regard, both data and power may be transmitted between host controller 110 and remote sensor interface 130. In this regard, power/data bus 120 may direct AC signal 125 and sensor signal 144. Stated differently, the power and data signals (i.e., AC signal 125 and sensor signal 144) may be transmitted through physically the same wires of power/data bus 120. In this regard, the power bus and the data bus may be the same bus.

Figure 3:
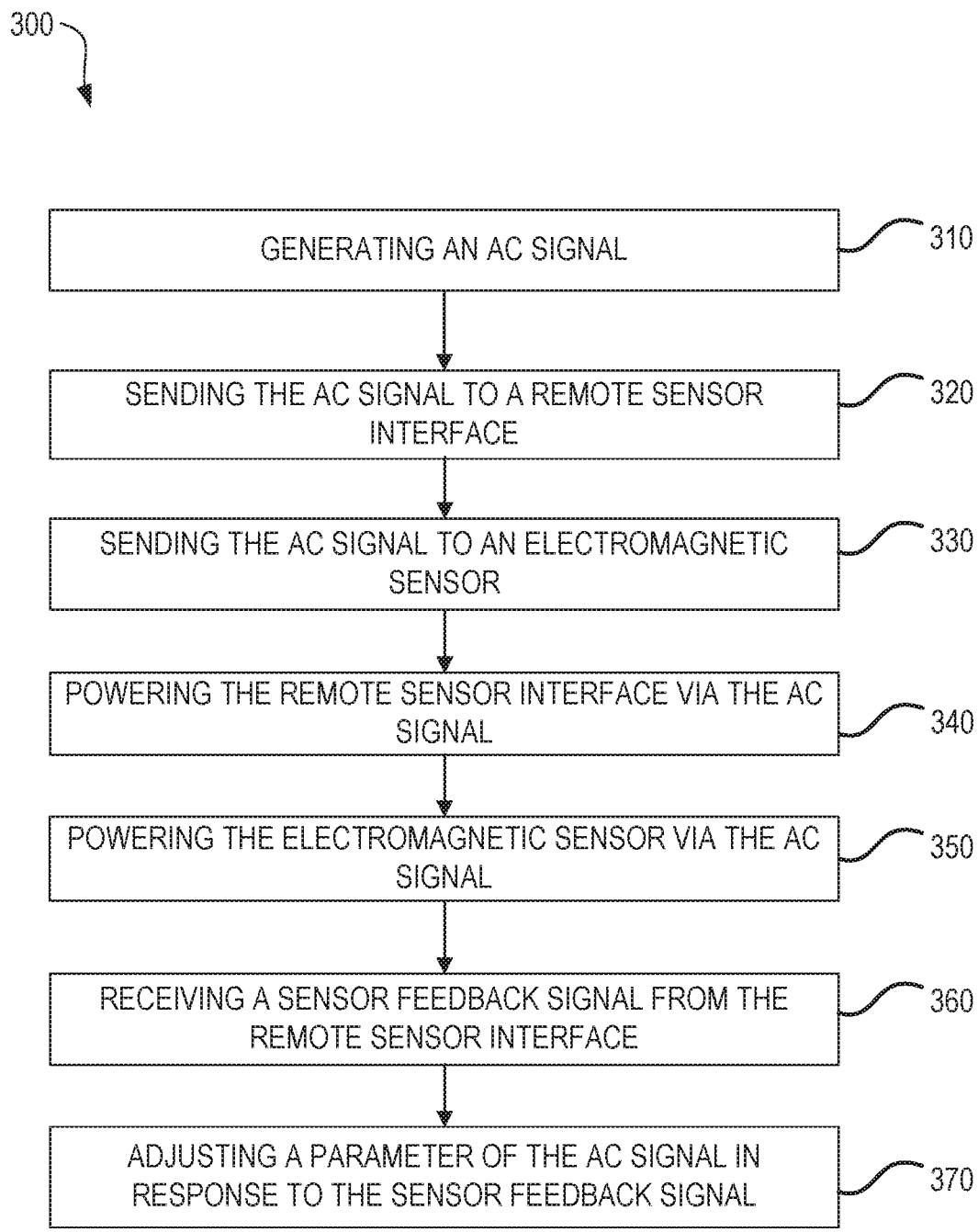
FIG. 3 illustrates a method for exciting an electromagnetic sensor, in accordance with various embodiments.

With reference to FIG. 3, a method 300 for exciting an electromagnetic sensor is provided, in accordance with various embodiments. Method 300 includes generating an AC signal (step 310). Method 300 includes sending the AC signal to a remote sensor interface (step 320). Method 300 includes sending the AC signal to the electromagnetic sensor (step 330). Method 300 includes powering the remote sensor interface via the AC signal (step 340). Method 300 includes powering the electromagnetic sensor via the AC signal (step 350). Method 300 includes receiving a sensor feedback signal from the remote sensor interface (step 360). Method 300 includes adjusting a parameter of the AC signal in response to the sensor feedback signal (step 370).

In various embodiments, with combined reference to FIG. 1 and FIG. 3, step 310 may include generating, by host controller 110, AC signal 125. Step 320 may include sending, by host controller 110, AC signal 125 to remote sensor interface 130, via power/signal bus 120. Step 330 may include sending, by host controller 110, AC signal 125 to electromagnetic sensor 140, via power/signal bus 120. Step 340 may include powering, by host controller 110, remote sensor interface 130 via AC signal 125. Step 350 may include powering, by host controller 110, electromagnetic sensor 140 via AC signal 125. Step 360 may include receiving, by host controller 110, a sensor feedback signal (i.e., sensor signal 144) from remote sensor interface 130. Step 370 may include adjusting, by host controller 110, a parameter (e.g., amplitude) of AC signal 125, in response to the sensor feedback signal (i.e., sensor signal 144).

Benefits, other advantages, and solutions to problems have been described herein with regard to specific embodiments. Furthermore, the connecting lines shown in the various figures contained herein are intended to represent various functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the inventions. The scope of the inventions is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Furthermore, no element, component, or method step in the present disclosure is intended to be dedicated to the public regardless of whether the element, component, or method step is explicitly recited in the claims. No claim element is intended to invoke 35 U.S.C. 112(f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A sensor control arrangement comprising:
    a host controller comprising:
        a first data communication interface;
        an excitation signal synthesizer in electronic communication with the first data communication interface; and
        an amplifier;
    a remote sensor interface configured to receive an AC signal from the host controller;
    a power/data bus extending between the host controller and the remote sensor interface; and
    an electromagnetic sensor configured to:
        receive the AC signal from the host controller via the power/data bus; and
        send a sensor signal to the remote sensor interface.

2. The sensor control arrangement of claim 1, wherein the remote sensor interface comprises:
    an AC to DC power conditioner;
    a signal processor; and
    a second data communication interface.

3. The sensor control arrangement of claim 2, wherein the AC to DC power conditioner receives the AC signal and converts the AC signal into a DC power signal.

4. The sensor control arrangement of claim 3, wherein at least one of the signal processor and the second data communication interface is powered by the DC power signal.

5. The sensor control arrangement of claim 2, wherein at least three wires extend between the sensor and the signal processor.

6. The sensor control arrangement of claim 5, wherein the electromagnetic sensor comprises a linear variable differential transformer.

7. The sensor control arrangement of claim 6, wherein the electromagnetic sensor comprises a rotary variable differential transformer.

8. The sensor control arrangement of claim 1, wherein the power/data bus comprises less than five wires.

9. A sensor control arrangement comprising:
    a host controller located at a first location;

a remote sensor interface located at a second location, wherein the second location is spaced apart from the first location by a distance;

a power/data bus extending between the host controller and the remote sensor interface; and an electromagnetic sensor in electronic communication with the remote sensor interface;

wherein the host controller is configured to send an alternating current (AC) signal to the remote sensor interface via the power/data bus, wherein the electromagnetic sensor is configured to receive the AC signal; and wherein the remote sensor interface is configured to:
receive an analog sensor signal from the electromagnetic sensor;
convert the analog sensor signal to a digital sensor signal; and
send the digital sensor signal to the host controller via the power/data bus.

10. The sensor control arrangement of claim 9, wherein the remote sensor interface is configured to convert the AC signal to a direct current (DC) signal.

11. The sensor control arrangement of claim 9, wherein the electromagnetic sensor is in electronic communication with the remote sensor interface via at least three wires.

12. The sensor control arrangement of claim 11, wherein the electromagnetic sensor comprises a linear variable differential transformer (LVDT).

13. The sensor control arrangement of claim 12, wherein the electromagnetic sensor comprises a rotary variable differential transformer (RVDT).

14. The sensor control arrangement of claim 9, wherein the distance comprises at least two feet.

15. The sensor control arrangement of claim 9, wherein the AC signal and the digital sensor signal are sent via the same wires of the power/data bus.

16. A method for exciting an electromagnetic sensor, comprising:
generating, by a host controller, an alternating current (AC) signal;
sending, by the host controller, the AC signal to a remote sensor interface, via a power/signal bus;
sending, by the host controller, the AC signal to the electromagnetic sensor, via the power/signal bus;
receiving, by the host controller, a sensor feedback signal from the remote sensor interface; and
adjusting, by the host controller, a parameter of the AC signal, in response to the sensor feedback signal.

17. The method of claim 16, further comprising:
powering, by the host controller, the remote sensor interface via the AC signal.

18. The method of claim 16, further comprising:
powering, by the host controller, the electromagnetic sensor via the AC signal.

19. The sensor control arrangement of claim 1, wherein the remote sensor interface is configured to:
receive the sensor signal from the electromagnetic sensor; and
generate a sensor feedback signal based upon the sensor signal.

20. The sensor control arrangement of claim 19, wherein the remote sensor interface is further configured to send the sensor feedback signal to the host controller via the power/data bus.

* * * * *